United States Patent
Kim et al.

(10) Patent No.: US 11,444,148 B2
(45) Date of Patent: Sep. 13, 2022

(54) RECOILED METAL THIN FILM FOR 3D INDUCTOR WITH TUNABLE CORE

(71) Applicant: Intel Corporation, Santa Clara, CA (US)

(72) Inventors: Gwang-Soo Kim, Portland, OR (US); Aaron D. Lilak, Beaverton, OR (US); Kumhyo Byon, Portland, OR (US); Doug Ingerly, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 758 days.

(21) Appl. No.: 16/222,253

(22) Filed: Dec. 17, 2018

(65) Prior Publication Data
US 2020/0194540 A1    Jun. 18, 2020

(51) Int. Cl.
| | | |
|---|---|---|
| *H01L 49/02* | (2006.01) | |
| *H01F 29/14* | (2006.01) | |
| *H01L 21/768* | (2006.01) | |
| *H01F 27/29* | (2006.01) | |
| *H01F 27/28* | (2006.01) | |
| *H01F 41/04* | (2006.01) | |
| *H01L 27/06* | (2006.01) | |

(52) U.S. Cl.
CPC ......... *H01L 28/10* (2013.01); *H01F 27/2804* (2013.01); *H01F 27/29* (2013.01); *H01F 29/146* (2013.01); *H01F 41/041* (2013.01); *H01L 21/76802* (2013.01); *H01L 21/76877* (2013.01); *H01L 21/76892* (2013.01); *H01L 27/0617* (2013.01)

(58) Field of Classification Search
CPC .............. H01L 28/10; H01L 21/76802; H01L 21/76877; H01L 21/76892; H01L 27/0617; H01F 27/2804; H01F 27/29; H01F 29/146; H01F 41/041; H01F 41/046; H01F 17/0033; H01F 17/0006
See application file for complete search history.

(56) References Cited

U.S. PATENT DOCUMENTS

| | | | | |
|---|---|---|---|---|
| 5,844,460 | A * | 12/1998 | Bogdan | H01F 17/0006 333/140 |
| 7,330,096 | B2 * | 2/2008 | Shah | H01F 37/005 336/213 |
| 7,707,714 | B2 * | 5/2010 | Schmidt | H01F 41/041 336/200 |
| 7,710,232 | B1 * | 5/2010 | Stalford | H01F 21/04 336/200 |
| 10,003,317 | B2 * | 6/2018 | Li | H03H 7/0115 |
| 10,280,898 | B1 * | 5/2019 | Chiao | H02K 7/183 |
| 10,490,328 | B2 * | 11/2019 | Li | H01F 17/02 |
| 11,031,456 | B2 * | 6/2021 | Li | H01L 28/10 |
| 2005/0013151 | A1 * | 1/2005 | Nathanson | H01L 27/1203 257/E29.295 |
| 2010/0019868 | A1 * | 1/2010 | Hyde | H01Q 15/0086 333/219 |

(Continued)

*Primary Examiner* — Jarrett J Stark
(74) *Attorney, Agent, or Firm* — Schwabe, Williamson & Wyatt, P.C.

(57) ABSTRACT

An inductor is disclosed. The inductor includes a vertically coiled conductor, a metal contact coupled to a first end of the vertically coiled conductor, and a dielectric material coupled to the metal contact. A tunable high permittivity component is coupled to a second end of the vertically coiled conductor.

14 Claims, 9 Drawing Sheets

(56) References Cited

U.S. PATENT DOCUMENTS

| | | | |
|---|---|---|---|
| 2010/0187695 A1* | 7/2010 | Chua | C25D 5/10 |
| | | | 257/751 |
| 2014/0103486 A1* | 4/2014 | Li | H01L 28/10 |
| | | | 29/605 |
| 2015/0099116 A1* | 4/2015 | Li | C30B 33/10 |
| | | | 216/36 |
| 2016/0301377 A1* | 10/2016 | Li | H03H 7/0115 |
| 2018/0075956 A1* | 3/2018 | Li | H01L 28/10 |
| 2020/0194540 A1* | 6/2020 | Kim | H01L 21/76802 |
| 2022/0146164 A1* | 5/2022 | Long | F25B 49/02 |

* cited by examiner

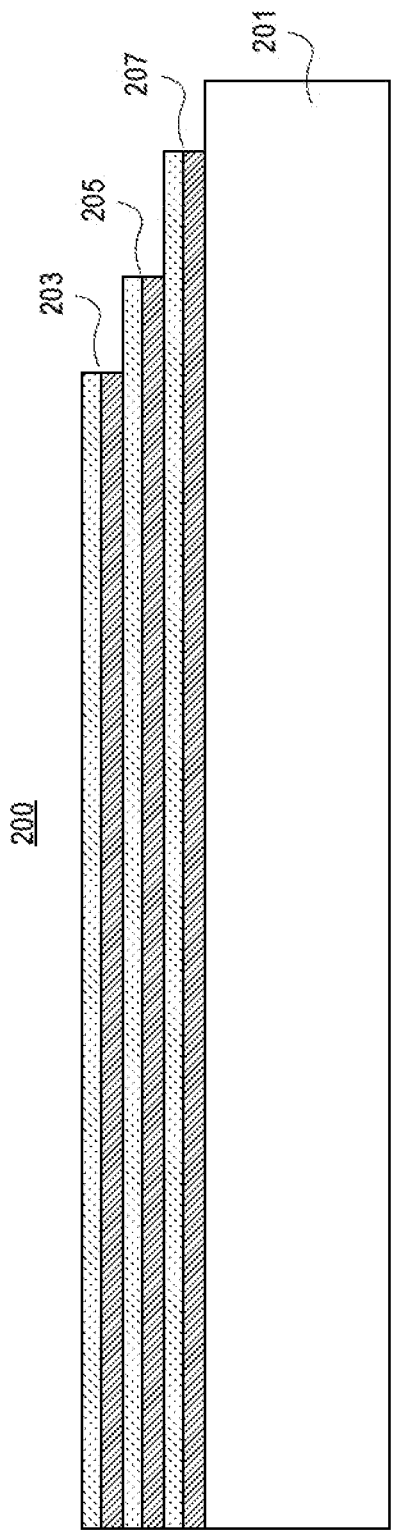
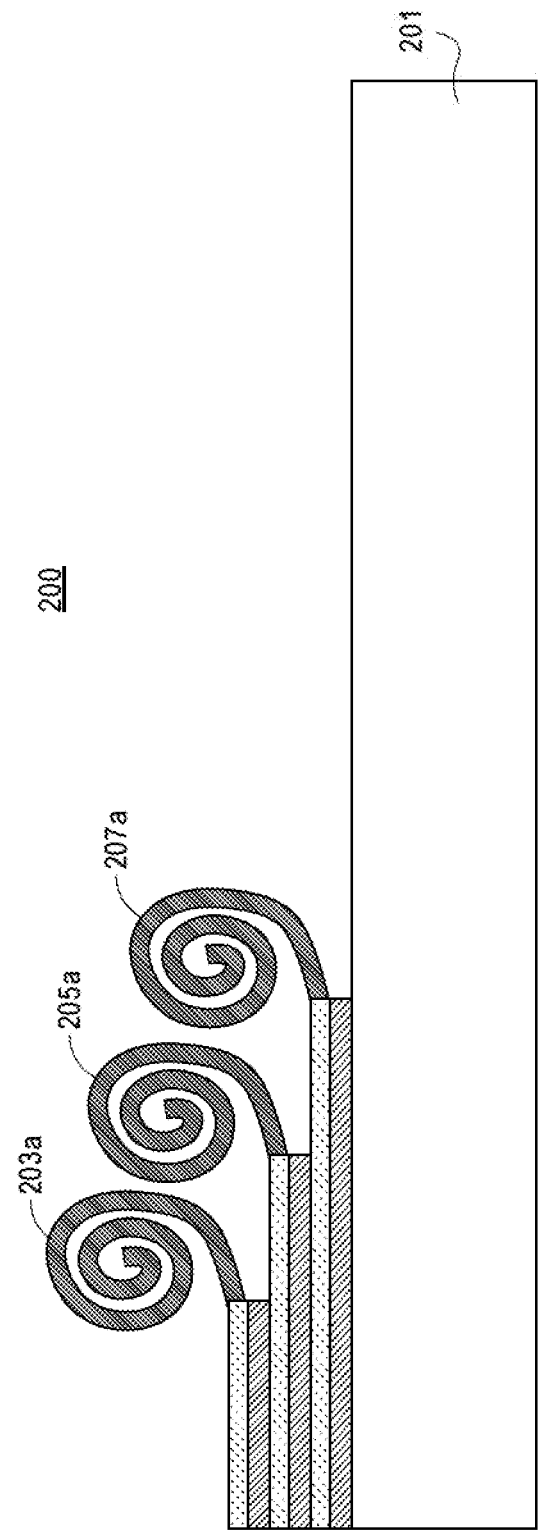

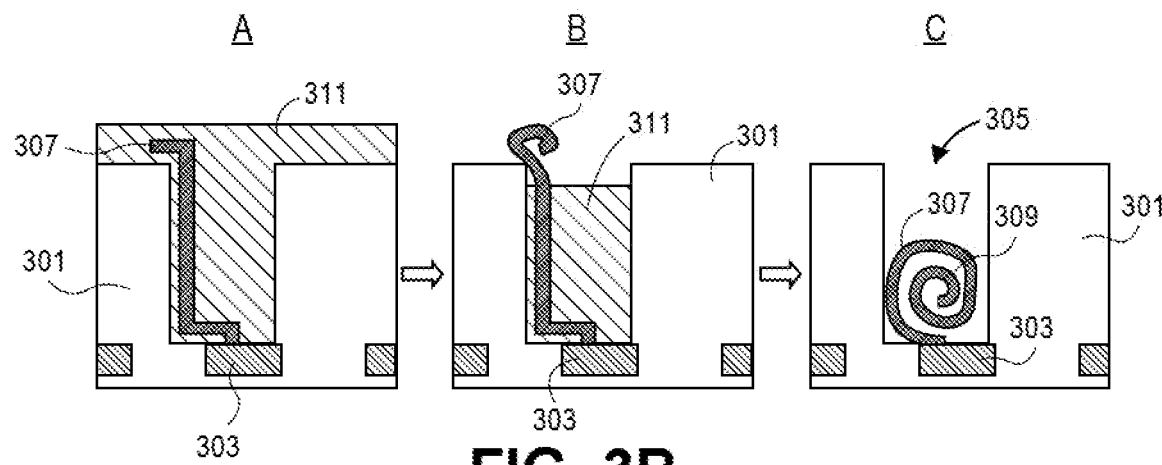
FIG. 3B
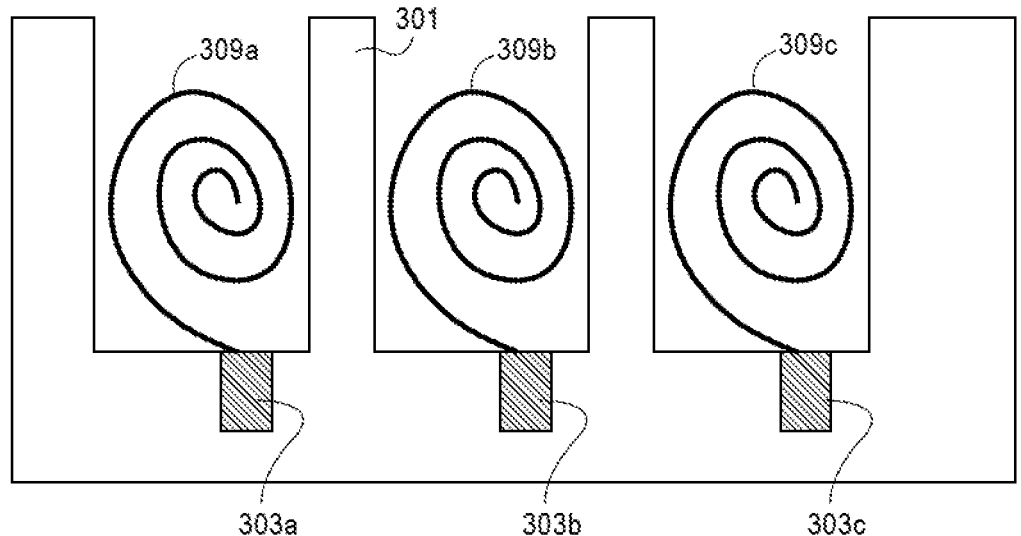
FIG. 3C
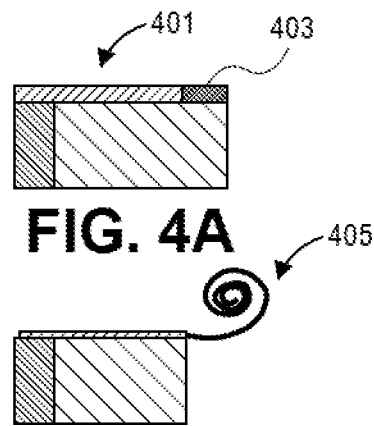
FIG. 4A
FIG. 4B
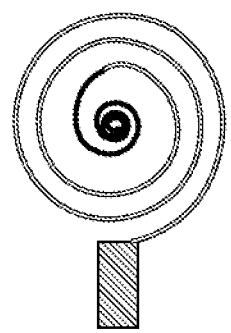
FIG. 4C

RECOILED METAL THIN FILM FOR 3D INDUCTOR WITH TUNABLE CORE

TECHNICAL FIELD

Embodiments of the disclosure pertain to recoiled metal thin films and, in particular, to recoiled metal thin films for three-dimensional (3D) inductors with tunable cores.

BACKGROUND

Inductors are essential components of radio frequency integrated circuits (RFICs). Reducing the size of inductors to keep pace with miniaturization is challenging because of the trade-offs between size and performance as well as fabrication complexity. Inductor types that have been used to reduce inductor size while maintaining inductor performance include planar spiral inductors, suspended microelectromechanical system (MEMS) inductors, and discrete self-rolled inductors.

Planar two-dimensional (2D) inductors require a large footprint for high performance. Suspended MEMS inductors require complex processing steps, which are not compatible with CMOS technology. Conventional discrete self-rolled inductors do not allow the tuning of the inductor core material, which is critical to improving inductor performance. In addition, discrete inductors consume excessive power and use large form factors, which are significant obstacles to use in mobile applications. In a conventional approach a lateral layout is used which consumes excessive area and is costly in terms of the lithographic operations that are required to obtain closely spaced inductors. Such approaches are susceptible to failed-delamination defects that occur at a first layer that can cause problems at other layers.

BRIEF DESCRIPTION OF THE DRAWINGS

FIG. 2A is an illustration of an assembly before release of metal layers in a previous approach.

FIG. 2B is an illustration of the final structure after the release of metal layers in FIG. 2A.

FIG. 3B is an illustration of operations that are part of the vertical formation of a recoiled inductor according to an embodiment.

FIG. 3C is an illustration of vertically formed adjacent inductors according to an embodiment.

FIGS. 4A-4C illustrates the manner in which a high-permittivity metal is placed at the center of an inductor coil according to an embodiment.

DESCRIPTION OF THE EMBODIMENTS

Figure 1A:
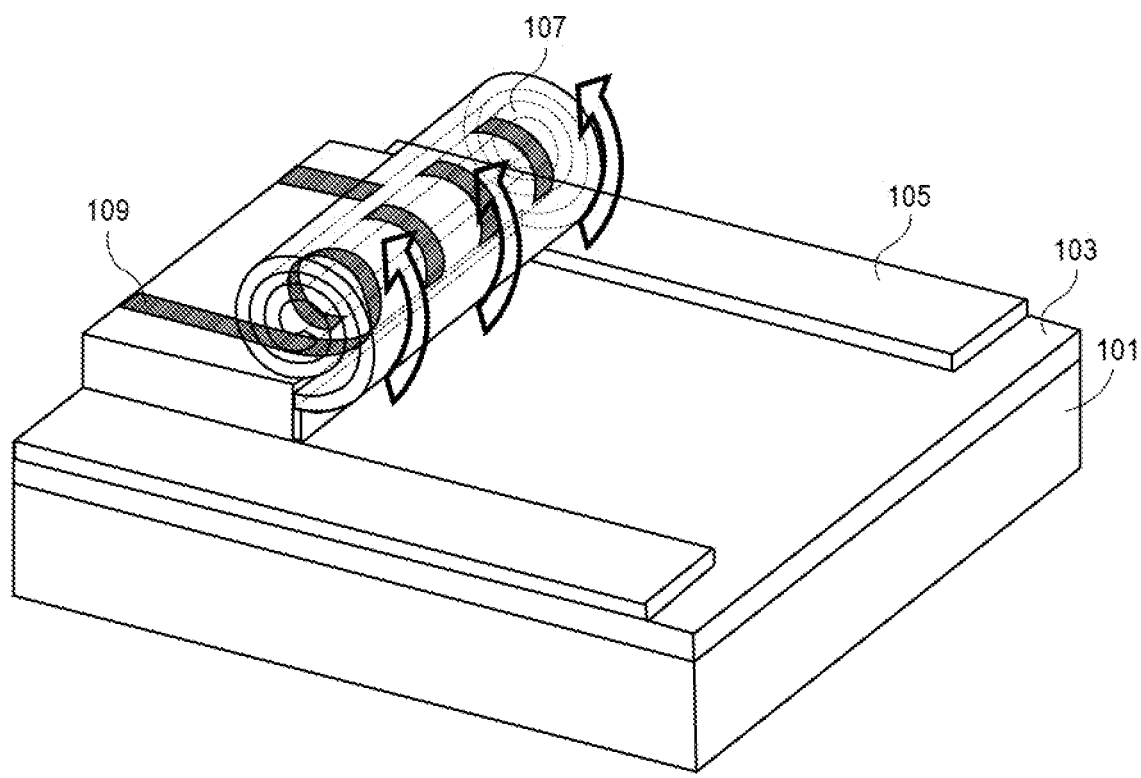
FIG. 1A is an illustration of a self-rolled inductor according to a previous approach.

A process for providing recoiled metal thin films for 3D inductors with tunable cores is described. It should be appreciated that although embodiments are described herein with reference to example recoiled metal thin films for 3D inductors with tunable cores, the disclosure is more generally applicable to recoiled metal thin films for 3D inductors with tunable cores as well as other type metal thin films for 3D inductors. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

2D inductors require a large footprint for high performance. Suspended MEM inductors require complex processing steps that are not compatible with CMOS technology. Conventional discrete self-rolled inductor approaches do not provide a capability to tune the inductor core material, which can be critical to improving inductor performance. In addition, discrete inductors can consume excessive power and can assume large form factors, which are significant obstacles to their use in mobile applications. In a conventional approach a lateral layout is used which consumes excessive area and is operationally costly in terms of the lithographic operations that are required to obtain closely spaced inductors. This approach is susceptible to failed-delamination defects that can be problematic.

A process and device that overcomes the shortcomings of such approaches is disclosed herein. As part of a disclosed approach, an integrated 3D inductor is constructed based on a vertically oriented recoiling of a metal thin film inside of a vertically oriented trench. In an embodiment, the sidewalls of the trench do not have to be completely vertical. For example, they can be slanted and may or may not have rounded bottom and/or upper corners. In other embodiments, the sidewalls of the trench can include other geometric forms. In an embodiment, the processing operations involved in forming the 3D inductor are compatible with semiconductor processing, die packaging, and chip stacking technologies. An embodiment includes material stacks for metal thin film recoiling, a thin film stack fixture to a mechanical support and/or electrical anchor, and a process to control recoiling behavior of the thin film stack.

An embodiment uses the controlled recoiling of high surface area metal film to form the 3D inductor. Additionally, an embodiment obtains vertical integration based on a vertical stacking of inductor parts that results in a small footprint. This is not possible using conventional 2D approaches. The disclosed approach provides a high Q factor inductor that is suitable for traditional applications such as RF, wireless modem, RFID, and transformer. In an embodiment, the 3D inductor does not make contact with foreign material and thus substrate loss is eliminated, and parasitics are minimized. In other embodiments, space within the recoiled inductor, which may or may not include the inner coils, can be fully or partially filled with dielectric material based on the application. It should be appreciated that the flexibility of tuning the core material enables a maximization of inductor performance.

FIG. 1A is a schematic of a self-rolled inductor according to a previous approach. FIG. 1A shows substrate 101, insulator 103, sacrificial substrate 105, coil 107 and inductor conductor/feed lines 109. Referring to FIG. 1A, the insulator 103 is formed over the substrate 101. The sacrificial substrate 105 is formed over the insulator 103. The inductor conductor/feed lines 109 are formed on the sacrificial substrate 105.

In an embodiment, the substrate 101 can be formed from silicon. In other embodiments, the substrate 101 can be formed from other materials. In an embodiment, the insulator 103 can be formed from silicon nitride. In other embodiments, the insulator 103 can be formed from other materials. In an embodiment, the sacrificial substrate 105 can be formed from silicon dioxide In other embodiments, the sacrificial substrate 105 can be formed from other materials. In an embodiment, the coil 107 can be formed from copper. In other embodiments, the coil 107 can be formed from other materials. In an embodiment, the inductor conductor/feed lines 109 can be formed from copper. In other embodiments, the inductor conductor/feed lines 109 can be formed from other materials.

Referring to FIG. 1A, a stressed metal is deposited on a sacrificial layer which is then etched to release the metal. As the sacrificial layer is removed the strain energy within the metal is released which causes the metal to coil in a prescribed manner (as dictated by the metal thickness and the stress state in the metal initially). To control the recoiling behavior and to provide the electrical contact, two metal terminals are attached at the end of the inductor. These terminals mechanically hold the thin film as the sacrificial layer is removed and the metal thin film recoils. FIG. 1A shows the direction of the inductor roll up.

Figure 1B:
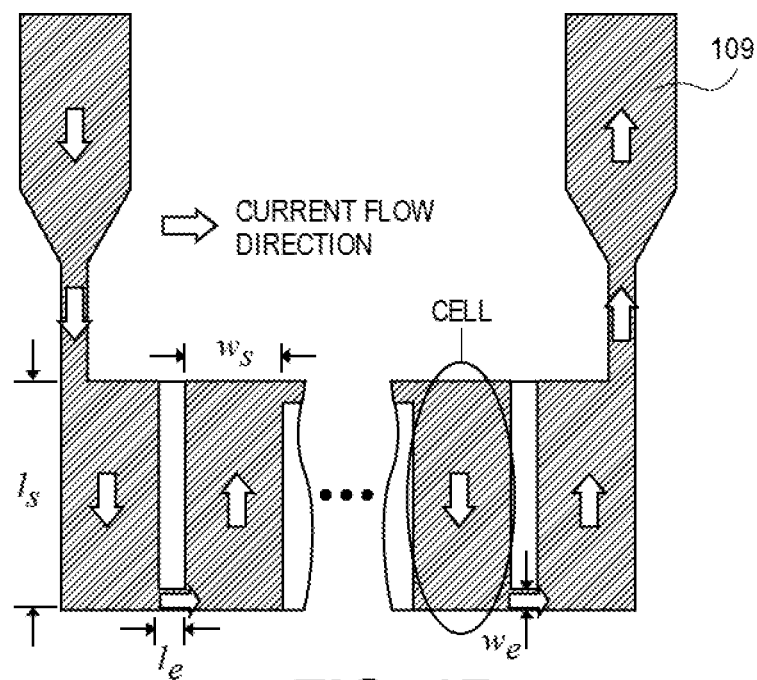
FIG. 1B is an illustration of the layout of the self-rolled inductor of FIG. 1A.

FIG. 1B is an illustration of the layout of the self-rolled inductor of FIG. 1A. Referring to FIG. 1B, the direction of current flow through the inductor is shown. As illustrated in FIG. 1B, the current flows through a first feed line, then through cells and connection lines, and subsequently out of a second feed line.

Figure 1C:
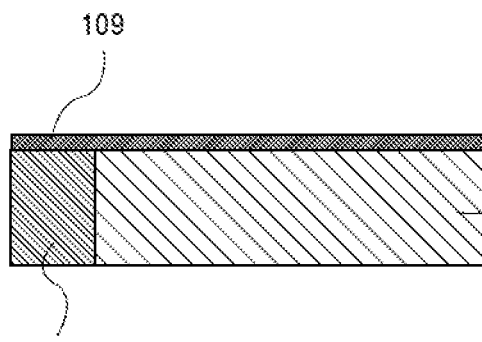
FIG. 1C is an illustration of the manner in which an inductor metal is formed with respect to a sacrificial substrate and an electrical and/or mechanical metal contact in a previous approach.
Figure 1D:
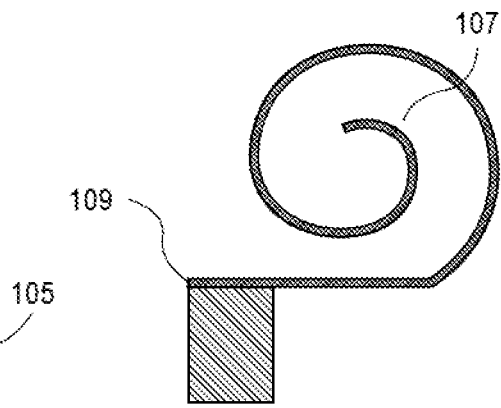
FIG. 1D is an illustration of a recoiled inductor metal of a previous approach.

FIG. 1C shows the manner in which the inductor metal is formed with respect to the sacrificial substrate 105 and an electrical and/or mechanical metal contact 111. Referring to FIG. 1C, the inductor conductor 109 is formed above sacrificial substrate 105 and the electrical and/or mechanical metal contact 111. In an embodiment, the stress and strain gradient within the inductor conductor 109 and the removal of the sacrificial substrate 105 releases the metal film and initiates the recoil behavior. The inductor conductor 109 in the cross-sectional view shown in FIG. 1C is patterned and coupled to the electrical and/or mechanical metal contact 111. A second electrical and/or mechanical metal contact (not shown in the cross-sectional view of FIG. 1C) is present behind the electrical and/or mechanical contact 111 so as to form the two-terminal device. FIG. 1D is an illustration of the coil 107 that is formed from the recoiled inductor conductor 109.

Figure 1E:
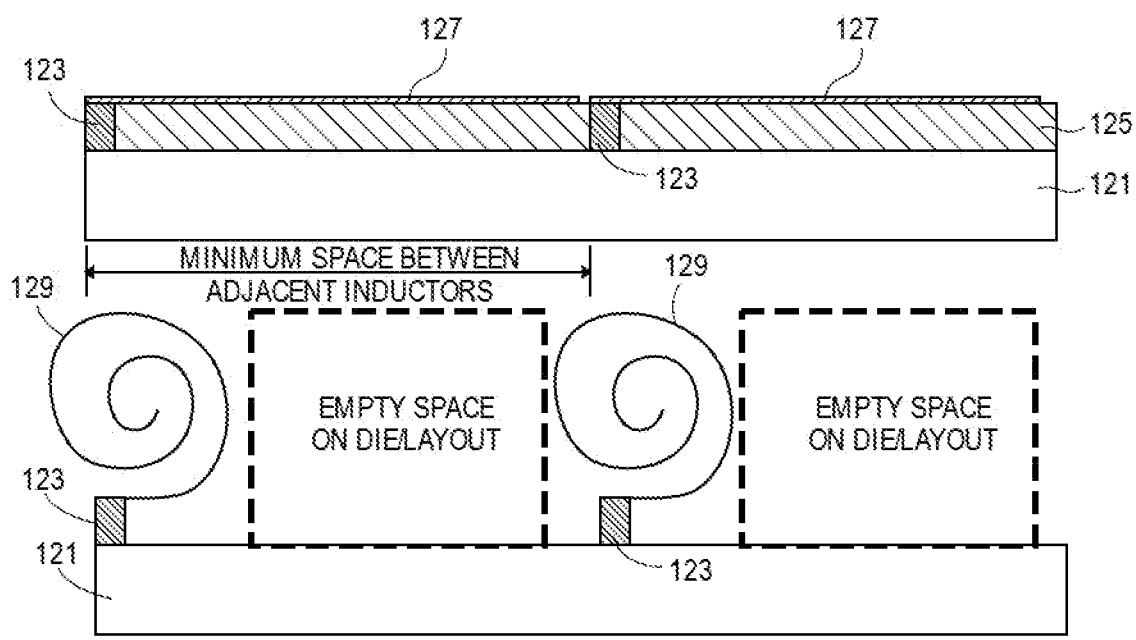
FIG. 1E illustrates the spacing shortcomings of the approach described with reference to FIGS. 1A-1D.

FIG. 1E illustrates the spacing shortcomings of the approach described with reference to FIGS. 1A-1D. FIG. 1E shows insulator 121, electrical and/or mechanical metal contact 123, sacrificial substrate 125, inductor metal 127 and inductor coils 129. Referring to FIG. 1E, the top illustration shows the structure prior to the rollup process. The bottom illustration shows the structure after the rollup process. As is shown in FIG. 1E, significant empty space is generated adjacent to the inductor coils 129 after the rollup process has been completed. These spaces are the minimum space or pitch that is achievable between adjacent inductors using this approach. This empty space, which is not avoidable using this approach, prevents a dense inductor layout.

FIGS. 2A and 2B illustrate another version of the previous approach described in FIGS. 1A-1E that enables the provision of inductors in closer proximity to each other than does the approach of FIGS. 1A-1E. In FIGS. 2A and 2B, the semiconductor structure 200 includes a substrate 201 and stepped inductor metal/sacrificial layers 203-207. FIG. 2A shows the assembly before release of the metal layers and FIG. 2B shows the final structure.

Referring to FIGS. 2A and 2B, although the approach shown therein can provide inductors that are located in closer proximity to each other than does the approach of FIGS. 1A-1E, it suffers from several significant drawbacks. For example, the operational complexity and cost of this approach is extreme in that every metal layer (or composite metal layer) requires a different mask and different lithographic operation. In addition, the introduction of a single delamination related defect within any of the metal layers will impact every inductor in the stacks beneath. Consequently, yield can be negatively impacted using this approach. Another disadvantage is that the elevation differential makes processing far more complicated using standard fabrication techniques as regards the formation of further sub-assemblies on the same main assembly containing the inductors. This is especially true as regards endpointing of etches and forming electrical contact to the inductors. In addition, the approach of FIGS. 2A and 2B does not address the dead/empty layout regions that are located adjacent (to the right) to the inductors 203a, 205a and 207a.

Figure 3A:
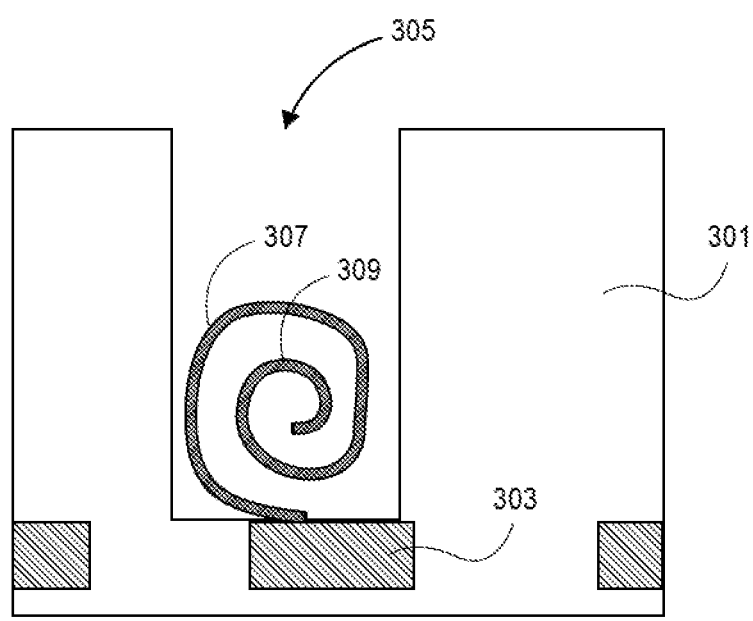
FIG. 3A shows a vertically recoiled inductor according to an embodiment.

FIG. 3A shows a vertically recoiled inductor according to an embodiment. FIG. 3A shows dielectric 301, metal contact 303, vertical trench 305, coil metal 307 and inductor 309.

Referring to FIG. 3A, the coil metal 307 is coupled to metal contact 303 and is coiled vertically downward in the vertical trench 305. The dielectric 301 is formed to include the vertical trench 305. The inductor 309 is formed above and between parts of dielectric 301. The metal contacts 303 are formed in the lower portion of the dielectric 301.

In an embodiment, the dielectric 301 can be formed from silicon nitride. In other embodiments, the dielectric 301 can be formed from other materials. In an embodiment, the contact 303 can be formed from copper. In other embodiments, the contact 303 can be formed from other materials. In an embodiment, the inductor 309 can be formed from copper. In other embodiments, the inductor 309 can be formed from other materials.

In an embodiment, the vertical trench approach of FIG. 3A offers a significant improvement as compared to the approach of FIG. 1A. For example, the introduction of a single delamination related defect in a vertical trench will impact just that one inductor. Consequently, yield can be far more easily achieved with the vertical trench approach than with the stacked metal approach. Another advantage is that all the inductors formed in the vertical-trench approach are located at the same level of elevation on the assembly, whereas, in the stacked metal approach the inductors can be located at different elevations. This elevation differential makes processing far more complicated using standard fabrication techniques as regards the formation of further sub-assemblies on the same main assembly containing the inductors. This is especially true as regards end-pointing of etches and forming electrical contacts to the inductors.

FIG. 3B shows operations that are a part of the vertical formation of the recoiled inductor 309 according to an embodiment. Referring to FIG. 3B, in the initial stage A, the coil metal 307 vertically extends through a sacrificial dielectric 311, from above the dielectric 301, into the electrical and/or mechanical metal contact 303. In stage B, the sacrificial dielectric layer 311 is removed. The removal of the sacrificial dielectric layer 311 results in a recoiling of the coil metal 307. In an embodiment, the inductor coil metal 307 coils in concert with the removal of the sacrificial dielectric layer 311 until the completed inductor 309 is formed inside the vertical trench 305 in stage C. In an embodiment, the surrounding dielectric material 301 is optional and can be used to define geometric confinement for inductor coils or electrical isolation with the neighboring devices.

In an embodiment, the length, the radius and the number of coils of an inductor determine the performance of the inductor and can be controlled by photo-lithography and stress engineering. The engineered stress in a metal film or dielectric liner is used to induce coiling. The inductor metal can be either a single metal or a composite. The use of single metals with intrinsic stress, the oxidation of metal surfaces, the use of composite metals (metal stacks) or metals with stress gradients can be used to control the curvature of the metal stacks, upward or downward depending on application. These techniques differ from the conventional approach.

In an embodiment, the amount of the recoiling behavior can also be engineered by controlling the thickness of the coil metal 307. In an embodiment, where coiling is not needed, a thicker film can be used. In parts that need more surface area and more coiling, a thinner film can be used. In an embodiment, for purposes of scale, the metal film can have a thickness of 5-100 nm thick. In other embodiments, other thicknesses can be used.

It should be appreciated that the above described vertical integration of the recoiled inductor 309 enables the achievement of dense layouts which differentiate the approach of FIGS. 3A-3C from the approach described with reference to FIGS. 1A-1E. In particular, it enables the formation of multiple inductors at the same level of elevation on the die. The inductors can be placed in close proximity (alleviating the minimum pitch constraint from the approach of FIG. 1A) which facilitates density improvements that are not possible in previous approaches.

For example, referring to FIG. 3C the vertical formation of inductors enables the pitch between adjacent inductors (or spacing with respect to other non-inductor devices) to be substantially reduced as compared to the approach of FIGS. 1A-1E. As shown in FIG. 3C, inductors 309a, 309b and 309c (coupled to electrical and/or mechanical metal contacts 303a, 303b and 303c) are formed within the lateral footprint of a single inductor. Accordingly, as additional inductors are added, the area savings increases. It should be appreciated that in an embodiment, active devices such as transistors or other devices can be placed below or between the inductors.

Example embodiments provide several advantages over the approaches described with reference to FIGS. 1A-1E. For example, separate lithography and separate masks are not required for every layer of metal, no height variation is introduced within the final assembly, a defect in the adhesion or delamination of any of the metal layers will not lead to issues with the formation of every inductor in the stack beneath the defect, and the dead/empty layout regions adjacent to the inductors in the approach of FIG. 1A are reduced/eliminated.

FIGS. 4A-4C illustrate the manner in which a high permittivity metal is inserted into an inductor core according to an embodiment. Referring to FIGS. 4A-4C a high-permittivity metal 403 (e.g., iron or other such metal) is inserted within the center of the inductor coil by using it as the end portion of the inductor metal 401. In particular, when the recoiling of the inductor metal 401 is completed, the high-permittivity metal 403 rests at the center of the coil 405. The insertion of this high permittivity metal into the core of the inductor represents a substantial improvement over conventional approaches as it enables the formation of higher quality (Q)-factor inductors than is provided by conventional approaches.

Advantages of exemplary embodiments include the space savings that is provided by the vertical trench inductor design described herein. Using previous approaches it is very difficult to utilize the space adjacent to the inductor (where the lateral metal was initially laid before it was recoiled) for another assembly. If integrated into a nano-assembly, it is likely that this space will remain empty as existing processing technologies can make it difficult and costly (would require additional lithography operations) to utilize this space. This empty space also provides a minimum distance between adjacent inductors where multiple inductors or inductors in series configuration may be required as shown in FIG. 1E. To address these limitations, in an embodiment, a deep trench is utilized within which the metal is deposited. In an embodiment, inductors (or inductors and other assemblies) can be positioned closer than the linear length of their metal coils at the same elevation. This approach enables very long metal regions to be coiled without consuming substantial die space. It also enables inductors to be placed in much closer proximity to each other than would be possible in previous approach. This vertical integration process is shown in FIG. 3A and represents a key differentiator from previous approaches.

In an embodiment, a metal contact at the bottom of the inductor can be used not only as an electrical contact, but also as a mechanical anchor to control the recoiling behavior during the processing. Therefore, multiple metal contacts without any specific electrical functionality can be used throughout the inductor layout design to control the final shape. The substrate underneath provides mechanical adhesion during the process. Key attributes of the substrate material should include mechanical adhesion during the processing and high selectivity during the etching to release the metal film from the substrate. The interlayer dielectric material can include but is not limited to silicon oxide and organic films, such as polydimethylsiloxane (PDMS) or photo-resist. In an embodiment, techniques described herein can be applied to nm-scale integrations.

Figure 5:
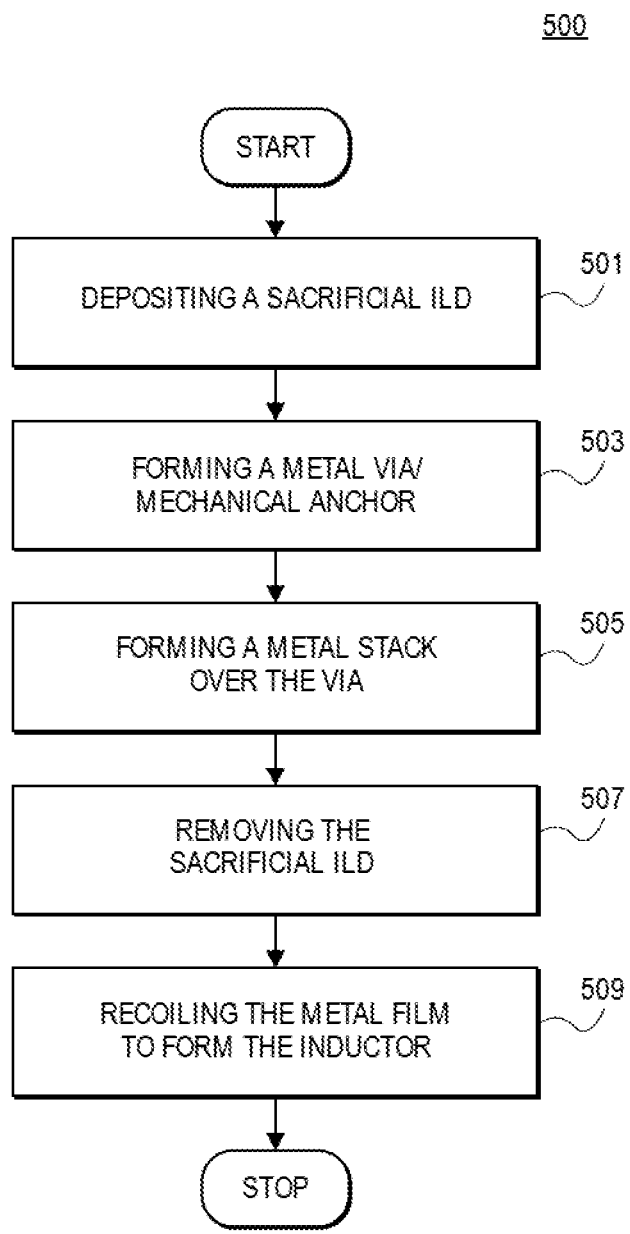
FIG. 5 shows a flowchart of a method for forming an inductor according to an embodiment.

FIG. 5 shows a flowchart of a method for forming a recoiled inductor according to an embodiment. Referring to FIG. 5, at 501 an ILD is formed on a previously formed substrate. In an embodiment, the ILD can be deposited. In other embodiments, the ILD can be formed in other manners. At 503, a metal via or mechanical anchor is formed in a selected location in the ILD using patterning, deposition and polish process. In other embodiments, the metal via or mechanical anchor can be formed in other manners. At 505, a metal stack/line is vertically deposited over the metal via and/or mechanical anchor. The adhesion between metal line and the metal via can be controlled by the dimension of the metal via and/or the mechanical anchor. In an embodiment, the larger the metal via the stronger the adhesion with the metal stack/line. At 507, a sacrificial ILD is removed with wet etching. In other embodiments, the sacrificial ILD can be removed in other manners. In an embodiment, the metal/ILD pattern can guide the release of the metal line, leading to controlled recoiling from the desired location. In an embodiment, as the sacrificial ILD is etched further, the metal stack/line is coiled further due to its inherent stress. At 509, the final recoiled film is formed. In an embodiment, in order to ensure that no particles/defects/debris are attached to the metal stack/line, an additional wet cleaning operation or ashing can be added. In an embodiment, the 3D inductors described herein can be formed on the backside of wafers/substrates. In an embodiment, the 3D inductors can be formed on the backside of wafers/substrates using a through-silicon via (TSV) or wafer bonding process that electrically connects the 3D inductors with main circuitry or other circuitry on the wafers/substrates.

Figure 6:
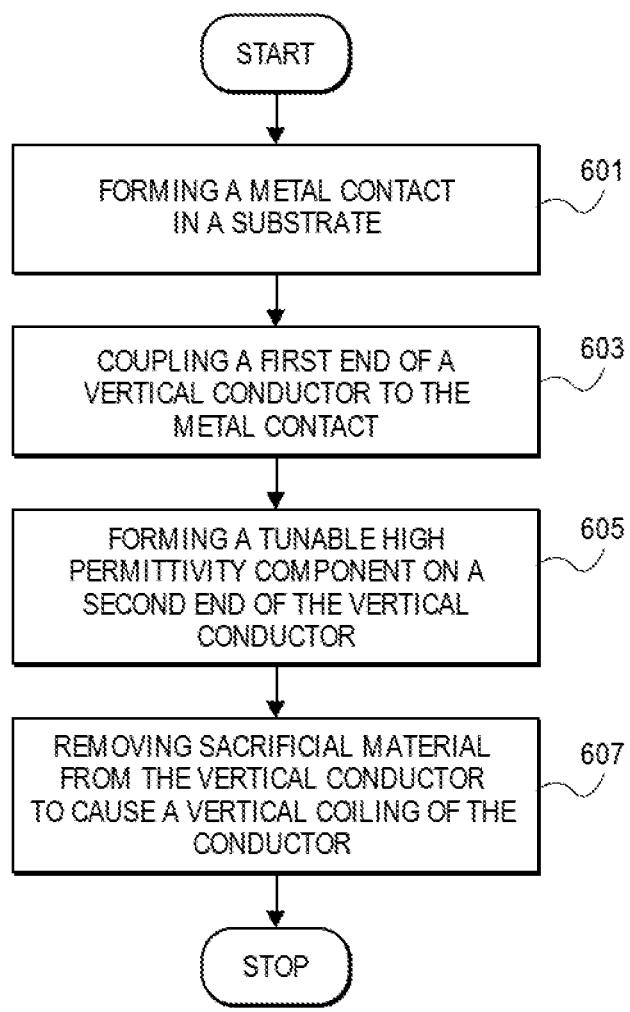
FIG. 6 shows a flowchart of a method for forming an inductor according to an embodiment.

FIG. 6 shows a flowchart of a method for forming a recoiled metal thin film for 3D inductor with tunable core according to an embodiment. The method includes at 601, forming a metal contact in a substrate. At 603, coupling a first end of a vertical conductor to the metal contact. At 605, forming a tunable high permittivity component on a second end of the vertical conductor. At 607, removing a sacrificial material from the vertical conductor to cause a vertical coiling of the vertical conductor to provide a vertically coiled conductor. In an embodiment, the vertical conductor can be formed in a via of a dielectric material. In an embodiment, the tunable high permittivity component can be a tunable high permittivity core. In an embodiment, the tunable high permittivity component can be coiled or uncoiled. In an embodiment, the vertically coiled inductors can be formed on a backside of a wafer. In an embodiment, a plurality of the vertically coiled conductors can be formed and active devices can be formed below one or more of the plurality of vertically coiled conductors or between the plurality of vertically coiled conductors.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials or amorphous semiconductors such as IGZO and NiO, or organic TFT materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 7:
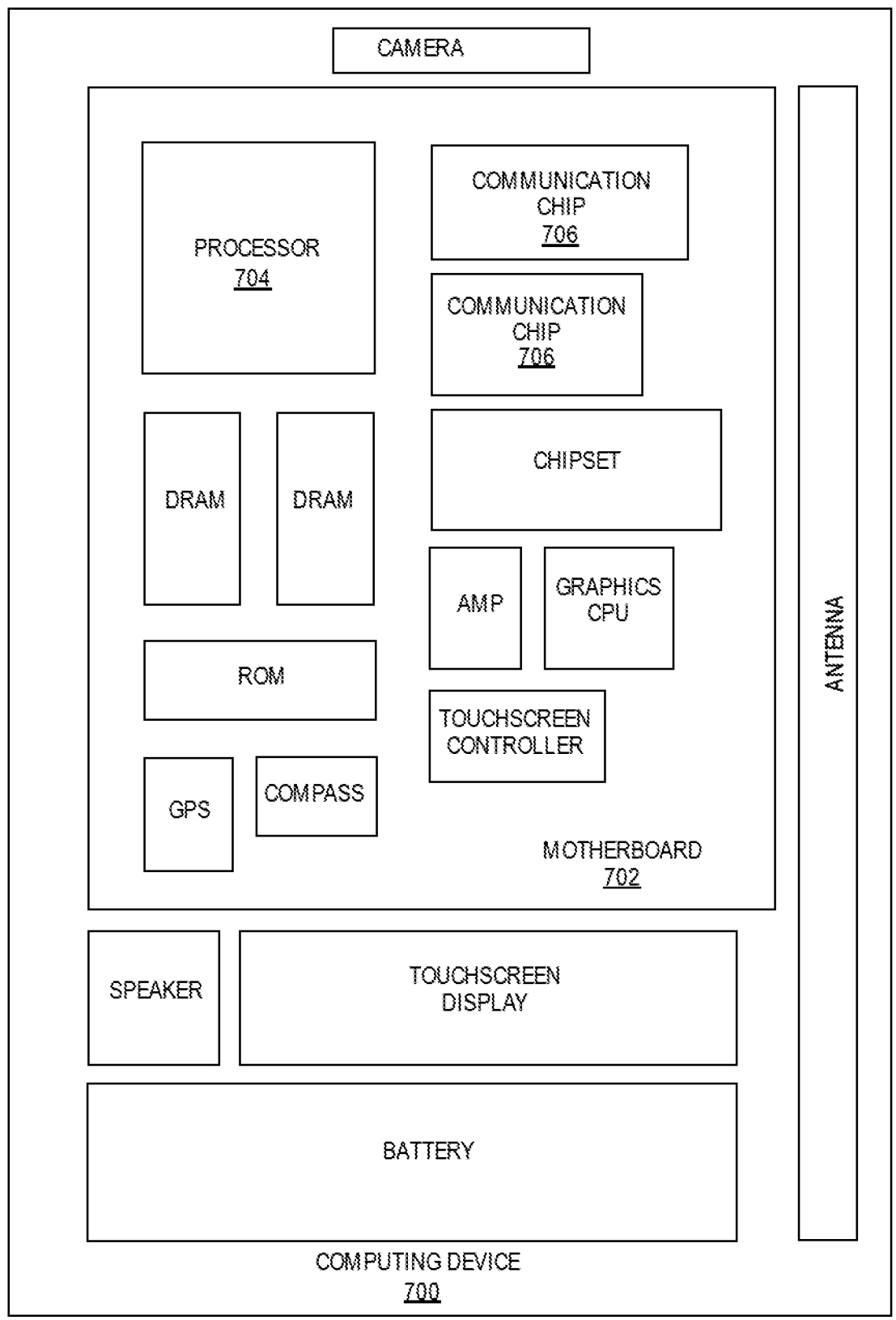
FIG. 7 illustrates a computing device in accordance with one implementation of an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
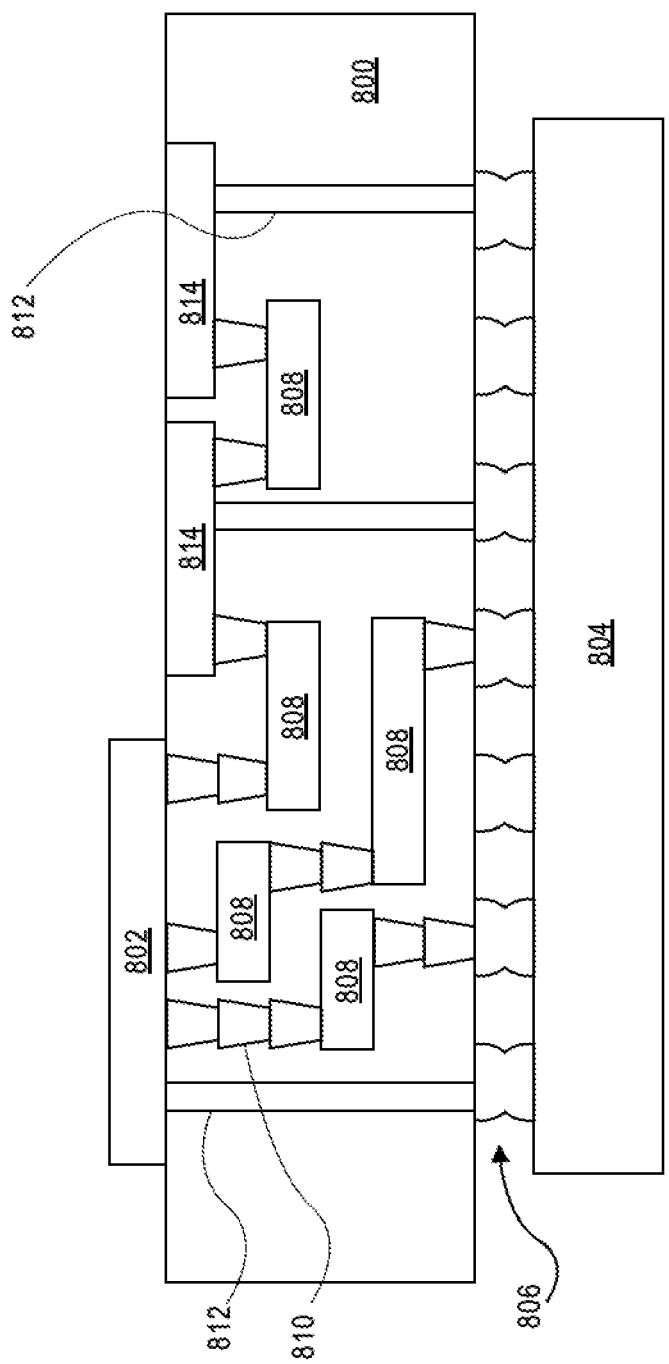
FIG. 8 illustrates an interposer that includes one or more embodiments.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

An inductor includes a vertically coiled conductor, a metal contact coupled to a first end of the vertically coiled conductor, a dielectric material coupled to the metal contact and a tunable high permittivity component coupled to a second end of the vertically coiled conductor.

Example Embodiment 2

The inductor of example embodiment 1, wherein the vertically coiled conductor is in a via of the dielectric material.

Example Embodiment 3

The inductor of example embodiment 1, wherein the tunable high permittivity component is a tunable high permittivity core.

Example Embodiment 4

The inductor of example embodiment 1, wherein the tunable high permittivity component is coiled.

Example Embodiment 5

The inductor of example embodiment 1, wherein the tunable high permittivity component is uncoiled.

Example Embodiment 6

The inductor of example embodiment 1, wherein the vertically coiled conductor is coiled vertically downward.

Example Embodiment 7

The inductor of example embodiment 1, 2, 3, 4, 5, or 6 wherein the vertically coiled inductor is coiled vertically upward.

Example Embodiment 8

A semiconductor structure includes a substrate, a plurality of inductors inductor coupled to the substrate, including, a vertically coiled conductor, a metal contact coupled to a first end of the vertically coiled conductor, a dielectric material coupled to the metal contact and a tunable high permittivity component coupled to a second end of the vertically coiled conductor.

Example Embodiment 9

The semiconductor structure of example embodiment 8, wherein the vertically coiled conductor is in a via of the dielectric material.

Example Embodiment 10

The semiconductor structure of example embodiment 8, wherein the tunable high permittivity component is a tunable high permittivity core.

Example Embodiment 11

The semiconductor structure of example embodiment 8, wherein the tunable high permittivity component is coiled.

Example Embodiment 12

The semiconductor structure of example embodiment 8, wherein the tunable high permittivity component is uncoiled.

Example Embodiment 13

The semiconductor structure of example embodiment 8, wherein the vertically coiled conductor is coiled vertically downward.

Example Embodiment 14

The semiconductor structure of example embodiment 8, 9, 10, 11, 12 or 13 wherein the vertically coiled inductor is coiled vertically upward.

Example Embodiment 15

A method including forming a metal contact in a substrate, coupling a first end of a vertical conductor to the metal contact, forming a tunable high permittivity component to a second end of the vertical conductor, and removing a sacrificial material from the vertical conductor to cause a vertical coiling of the vertical conductor.

Example Embodiment 16

The method of example embodiment 15, wherein the vertical conductor is formed in a via of a dielectric material.

Example Embodiment 17

The method of example embodiment 15, wherein the tunable high permittivity component is a tunable high permittivity core.

Example Embodiment 18

The method of example embodiment 15, wherein the tunable high permittivity component is coiled.

Example Embodiment 19

The method of example embodiment 15, 16, 17 or 18 further comprising forming a plurality of the vertically coiled conductors and forming active devices below one or more of the plurality of vertically coiled conductors or between the plurality of vertically coiled conductors.

Example Embodiment 20

The method of example embodiment 19 wherein the vertically coiled conductors are formed on a backside of a wafer.

What is claimed is:

1. An inductor, comprising:
   a vertically coiled conductor;
   a metal contact coupled to a first end of the vertically coiled conductor;
   a dielectric material coupled to the metal contact; and
   a tunable high permittivity component coupled to a second end of the vertically coiled conductor.

2. The inductor of claim 1, wherein the vertically coiled conductor is in a via of the dielectric material.

3. The inductor of claim 1, wherein the tunable high permittivity component is a tunable high permittivity core.

4. The inductor of claim 1, wherein the tunable high permittivity component is coiled.

5. The inductor of claim 1, wherein the tunable high permittivity component is uncoiled.

6. The inductor of claim 1, wherein the vertically coiled conductor is coiled vertically downward.

7. The inductor of claim 1, wherein the vertically coiled inductor is coiled vertically upward.

8. A semiconductor structure, comprising:
   a substrate;
   a plurality of inductors coupled to the substrate, including:
   a vertically coiled conductor;
   a metal contact coupled to a first end of the vertically coiled conductor;
   a dielectric material coupled to the metal contact; and
   a tunable high permittivity component coupled to a second end of the vertically coiled conductor.

9. The semiconductor structure of claim 8, wherein the vertically coiled conductor is in a via of the dielectric material.

10. The semiconductor structure of claim 8, wherein the tunable high permittivity component is a tunable high permittivity core.

11. The semiconductor structure of claim 8, wherein the tunable high permittivity component is coiled.

12. The semiconductor structure of claim 8, wherein the tunable high permittivity component is uncoiled.

13. The semiconductor structure of claim 8, wherein the vertically coiled conductor is coiled vertically downward.

14. The semiconductor structure of claim 8, wherein the vertically coiled inductor is coiled vertically upward.

* * * * *